US005113088A

United States Patent [19]

Yamamoto et al.

[11] Patent Number: 5,113,088

[45] Date of Patent: May 12, 1992

[54] SUBSTRATE BIAS GENERATING CIRCUITRY STABLE AGAINST SOURCE VOLTAGE CHANGES

[75] Inventors: Takayuki Yamamoto; Sampei Miyamoto, both of Tokyo, Japan

[73] Assignee: Oki Electric Industry Co., Ltd., Tokyo, Japan

[21] Appl. No.: 519,572

[22] Filed: May 7, 1990

Related U.S. Application Data

[63] Continuation-in-part of Ser. No. 433,213, Nov. 7, 1989, abandoned.

[30] Foreign Application Priority Data

Nov. 9, 1988 [JP] Japan ............................ 63-283448

[51] Int. Cl.[5] ............................ H03K 3/01

[52] U.S. Cl. ............................ 307/296.2; 307/296.8

[58] Field of Search ............................ 307/296.2, 304, 296.8

[56] References Cited

U.S. PATENT DOCUMENTS 4,142,114 2/1979 Green ............................ 307/296.2
4,439,692 3/1984 Beekmans et al. ............................ 307/296.2
4,471,290 9/1984 Yamaguchi ............................ 307/296.2
4,794,278 12/1988 Vajdic ............................ 307/296.2

FOREIGN PATENT DOCUMENTS 57-121269 7/1982 Japan .
62-190746 8/1987 Japan .

OTHER PUBLICATIONS

Japanese Laid-Open publication No. 57-121269 of Jul. 28, 1982.
Japanese Laid-Open publication No. 62-190746 of Aug. 20, 1987.

*Primary Examiner*—Edward P. Westin
*Assistant Examiner*—Richard Roseen
*Attorney, Agent, or Firm*—Spencer & Frank

[57] ABSTRACT

Substrate bias generating circuitry for generating a substrate bias to be applied to the substrate of an integrated circuit. The circuitry includes an oscillator circuit for generating oscillator pulses having a predetermined frequency. A charge pump circuit has a capacitor and charges and discharges the capacitor in response to the oscillator pulses for generating the substrate bias. A substrate bias level sensing circuit is responsive to the voltage level of the substrate bias for outputting a control signal associated with the sensed voltage level. The level sensing circuit has a level holding subcircuit for holding the control signal in an enabled state at least for a predetermined duration which is four times as long as a period of time necessary for the charge pump circuit to complete a pumping operation. The pumping operation of the charge pump circuit is controlled by the control signal.

6 Claims, 6 Drawing Sheets

SUBSTRATE BIAS GENERATING CIRCUITRY STABLE AGAINST SOURCE VOLTAGE CHANGES

This is a continuation-in-part of application Ser. No. 07/433,213 filed on Nov. 7, 1989 now abandoned.

BACKGROUND OF THE INVENTION

1. Field of the Invention

The present invention relates to substrate bias generating circuitry for maintaining a substrate loaded with a semiconductor integrated circuit (IC) or similar IC at a predetermined potential.

2. Description of the Prior Art

It has been customary with a memory or similar semiconductor IC to provide a semiconductor substrate with a substrate bias generating circuit for the purpose of preventing the substrate from reaching a given potential (e.g. positive potential) and thereby being biased in the forward direction, or for the purpose of reducing the coupling capacitance to promote rapid response. Specifically, a substrate bias voltage generated by the substrate bias generating circuit (usually a negative voltage) is applied across the semiconductor substrate to bias it in the reverse direction.

Substrate bias generating circuitry for the above application has been proposed in various forms, as disclosed in Japanese Patent Laid-Open Publication Nos. 121269/1982 and 190746/1987 by way of example. A circuit typical of such prior art circuitry is shown in FIG. 2 of the accompanying drawings.

In FIG. 2, the prior art substrate bias generating circuitry has an oscillator 10 for generating oscillating output pulses S10, FIG. 3, and a substrate bias level sensing circuit 20 for sensing the level of a substrate bias voltage Vbb to produce a control signal S20. A charge pump circuit 30 is connected to the outputs of the circuits 10 and 20 in order to generate the substrate bias voltage Vbb.

The substrate bias level sensing circuit 20 has a series connection of n-channel MOS transistors 21, 22 and 23 between a power source voltage Vcc and the substrate bias voltage Vbb. Inverters 24 and 25 are connected in series to a node N1 between the MOS transistors 21 and 22. The charge pump circuit 30 has a NAND gate 31 which is connected to the outputs of the oscillator 10 and substrate bias level sensing circuit 20. A node N3 is connected to the output node N2 via a capacitor 32. The node N3 is connected to ground potential Vss via an n-channel MOS transistor 33 and to the substrate 1 via an n-channel MOS transistor 34 and a node N4.

The operation of the prior art circuitry shown in FIG. 2 will be described with reference to FIG. 3. As shown, when the control signal S20 appearing on the output of the substrate bias level sensing circuit 20 is in (logical) high level or "H", the charge pump circuit 30 performs a pumping operation in response to an output pulse S10 of the oscillator 10. More specifically, when the output pulse S10 is in (logical) low level or "L" and the node N2 is in "H", the potential on the node N3 is equal to a threshold voltage Vt of the n-channel MOS transistor 33 and, hence, both the n-channel MOS transistors 33 and 34 remain turned off. On the turn of the output pulse S10 from "L" to "H", the node N2 turns from "H" to "L" so that the potential on the node N3 is lowered to (Vt−Vcc) by the capacitor 32. Consequently, the n-channel MOS transistor 34 is turned on to in turn cause the node N4 to output the substrate bais voltage Vbb and feed it to the substrate 1. Afterwards, the potential on the node N3 is restored to Vbb−Vt, and the MOS transisitor 34 is rendered non-conductive.

As the level of the substrate bias voltage Vbb lowers, the level on the node N1 also lowers in response thereto. Upon the level on the node N1 going lower than circuit threshold level V0 of inverter 24, the control signal S20 turns from "H" to "L". On the change of the control signal S20 to "L", the node N2 turns from "L" to "H". Upon the transition of the potential of the node N2 to "H", the capacitor 32 causes the potential on the node N3 to be elevated to (Vbb−Vt+Vcc).

Afterwards, as soon as the substrate bias voltage Vbb rises, the level on the node N1 goes also high in response thereto. Upon the level on the node N1 rising beyond circuit threshold level V0, the control signal S20 turns to "H" to cause the charge pump circuit 30 to perform a pumping operation, as previously stated.

The prior art circuitry described above with reference to FIG. 2 has some critical problems left unsolved. Specifically, assume that the potential on the node N1 has fluctuated up or down around the circuit threshold of the inverter 24, i.e., the reference level V, due to the change in any of the voltages Vcc, Vss and Vbb. Then, the duration for the control signal to remain in "H" varies and thereby prevents the control signal from remaining in "H" even for the minimum period of time necessary for the pumping operation of the charge pump circuit 30. In this condition, the potential on the node N3 fails to reach a sufficiently high level, rendering the pumping operation inaccurate and unstable. This would lead to a decrease in the efficiency of substrate bias voltage Vbb supply.

SUMMARY OF THE INVENTION

It is therefore an object of the present invention to provide substrate bias generating circuitry which is free from unstable pumping operations ascribable to changes in power source voltage or similar voltage.

In accordance with the present invention, substrate bias generating circuitry for generating a substrate bias to be applied to a substrate of an IC comprises an oscillator circuit for generating oscillator pulses having a predetermined frequency, a charge pump circuit including a charge storing element and means for charging and discharging the charge storing element in response to the oscillator pulses for generating the substrate bias, and a level sensing circuit responsive to a voltage level of the substrate bias for outputting a control signal associated with the sensed voltage level. The level sensing circuit comprises a level holding circuit for holding the control signal in an enabled state at least for a predetermined duration which is substantially four times as long as a period of time necessary for the charge pump circuit to complete a pumping operation. The pumping operation of the charge pump circuit is controlled by the control signal.

Once the control signal is enabled, the level holding circuit maintains it in the enabled state during a period of time which is at least substantially four times as long as a period of time necessary for the charge pump circuit to complete a pumping operation. This allows the charge pump circuit to perform stable pumping operations even though the source voltage, for example, may fluctuate.

The stability of pumping operations is further enhanced because the oscillator circuit is driven by the control signal which remains in an enabled state for a predetermined period of time, i.e., the charge pump circuit is operated by the output pulses of the oscillator circuit.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
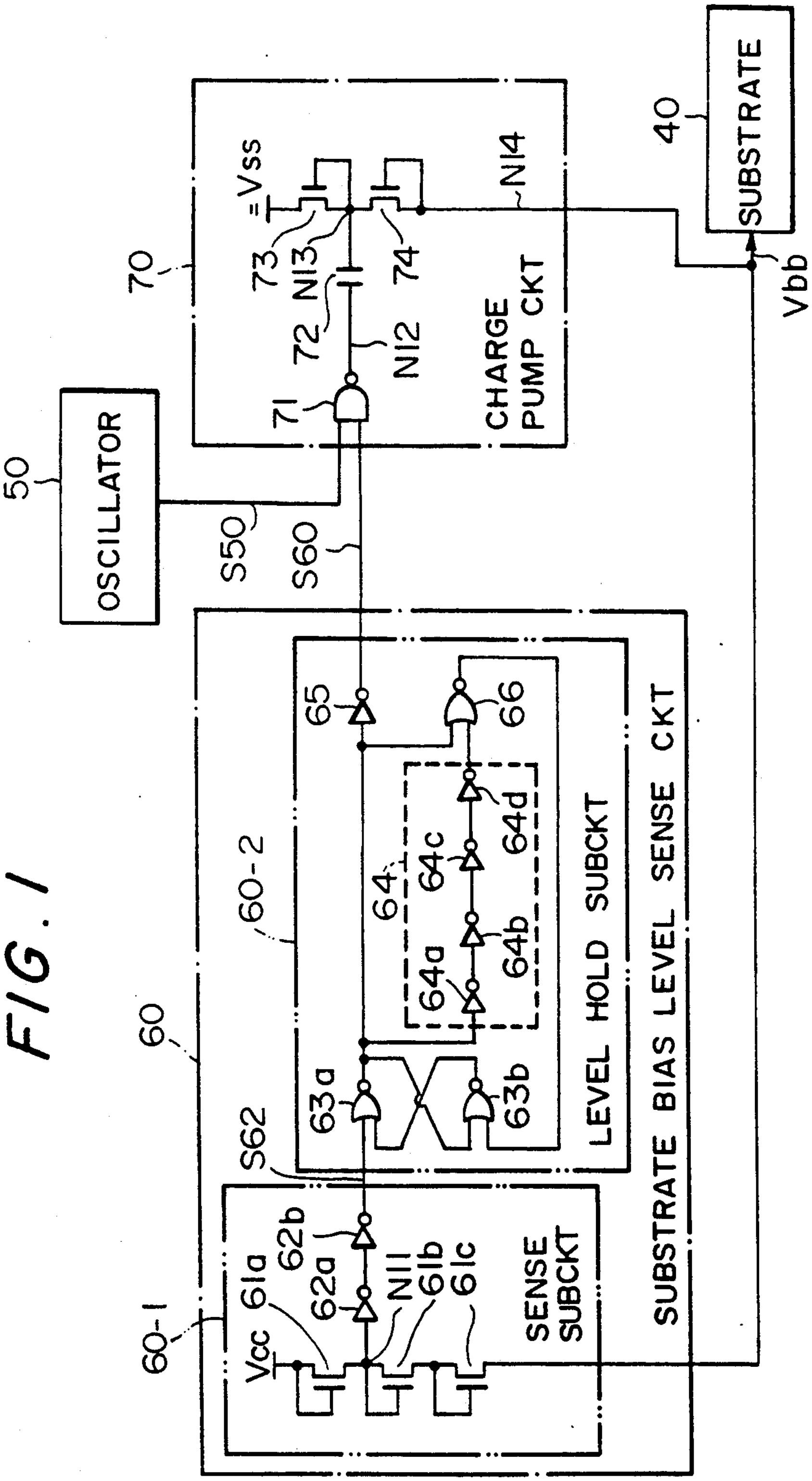
FIG. 1 is a schematic block diagram showing substrate bias generating circuitry embodying the present invention.
Figure 2:
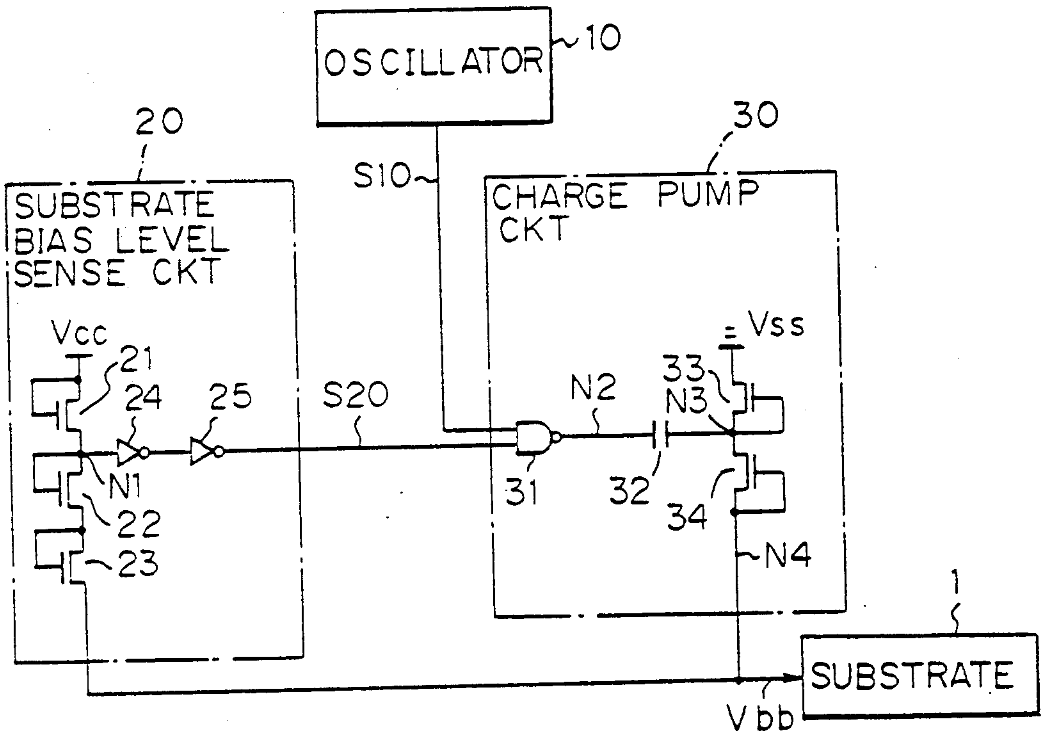
Fig. 2 PRIOR ART
FIG. 2 is a schematic block diagram showing a specific construction of prior art substrate bias generating circuitry.

Referring to FIG. 1 of the drawings, a preferred embodiment of the substrate bias generating circuitry in accordance with the present invention is shown. The circuitry serves to maintain the potential of a substrate 40 at a predetermined level such as about −3 volts, on which substrate is formed a semiconductor IC or similar IC. The circuitry has an oscillator 50 for oscillating to produce output pulses S50, FIG. 4, whose period is $4T_0$ and duty factor is ½, and a substrate bias level sensing circuit 60. The oscillator 50 may be of the self-oscillation type, for example. A charge pump circuit 70 is connected to the outputs of the oscillator 50 and bias level sensing circuit 60.

The substrate bias level sensing circuit 60 is responsive to a bias voltage Vbb being applied across the substrate 40. On sensing a change in the level of the bias voltage Vbb, the circuit 60 delivers a control signal S60 for activating the charge pump circuit 70 over a predetermined period of time and thereby controls the pumping operation of the circuit 70. Thus, the bias level sensing circuit 60 functions to save current which will be consumed in a standby condition. This circuit 60 is made up of a sensing subcircuit 60-1 and a level holding subcircuit 60-2. The sensing subcircuit 60-1 detects changes of the substrate bias voltage Vbb to produce a signal S62 in response thereto, while the level holding subcircuit 60-2 holds the control signal S60 at logical high level or "H" for at least a period of time necessary for pumping operation when the signal S62 turns to "H".

The sensing subcircuit 60-1 is composed of n-channel MOS transistors 61*a*, 61*b* and 61*c*, and inverters 62*a* and 62*b*. The n-channel MOS transistors 61*a*, 61*b* and 61*c* are connected in series between a power source voltage Vcc and the substrate bias voltage Vbb. The inverters 62*a* and 62*b* are interconnected in series to a node N11 between the MOS transistors 61*a* and 61*b*. Each of the MOS transistors 61*a*, 61*b* and 61*c* has drain and gate electrodes commonly connected.

The level holding subcircuit 60-2 includes a NOR gate 63*a* which has one input port coupled to the output S62 from the level sensing subcircuit 60-1 and another input port connected to an output port from another NOR gate 63*b*. The NOR gate 63*b* has one input port coupled to an output port from the NOR gate 63*a* and another input port connected to an output port of another NOR gate 66. The output of the NOR gate 63*a* is also interconnected to input ports of a delay circuit 64, an inverter 65 and the NOR gate 66. The delay circuit 64 has an output port interconnected to another input to the NOR gate 66. The inverter 65 has an output port interconnected to an input port of a NAND gate 71 included in the charge pump circuit 70. The NOR gates 63*a* and 63*b* thus cascaded enable the signal S62 to be latched in its "H" state. The delay circuit 64 is made up of multiple inverters 64*a* to 64*d* to establish a delay time T1 which may be equal to or longer than one period, 4T0, of the output pulses S50 of the oscillator 50 by way of example.

The charge pump circuit 70 is enabled when the control signal S60 fed from the substrate bias level sensing circuit 60 turns from "L" to "H" (an enable state). When enabled, the charge pump circuit 70 charges and discharges in synchronism with the output pulses S50 of the oscillator 50 for thereby generating the bias voltage Vbb on its output N14. Specifically, the charge pump circuit 70 has a NAND gate 71 for controlling the entry of the output pulses S50 in response to the control signal S60, and a capacitor 72 connected at one plate thereof to the output node N12 of the NAND gate 71. The other plate of the capacitor 72 is connected to a node N13. Also connected to the node N13 are the drain and gate electrodes of an n-channel MOS transistor 73 and the source electrode of an n-channel MOS transistor 74. The source electrode of the MOS transistor 73 is connected to ground voltage Vss. The gate and drain electrodes of the MOS transistor 74 are connected to the substrate 40 via the node N14. These transistors 73 and 74 constitute a rectifying circuit in combination.

Figure 4:
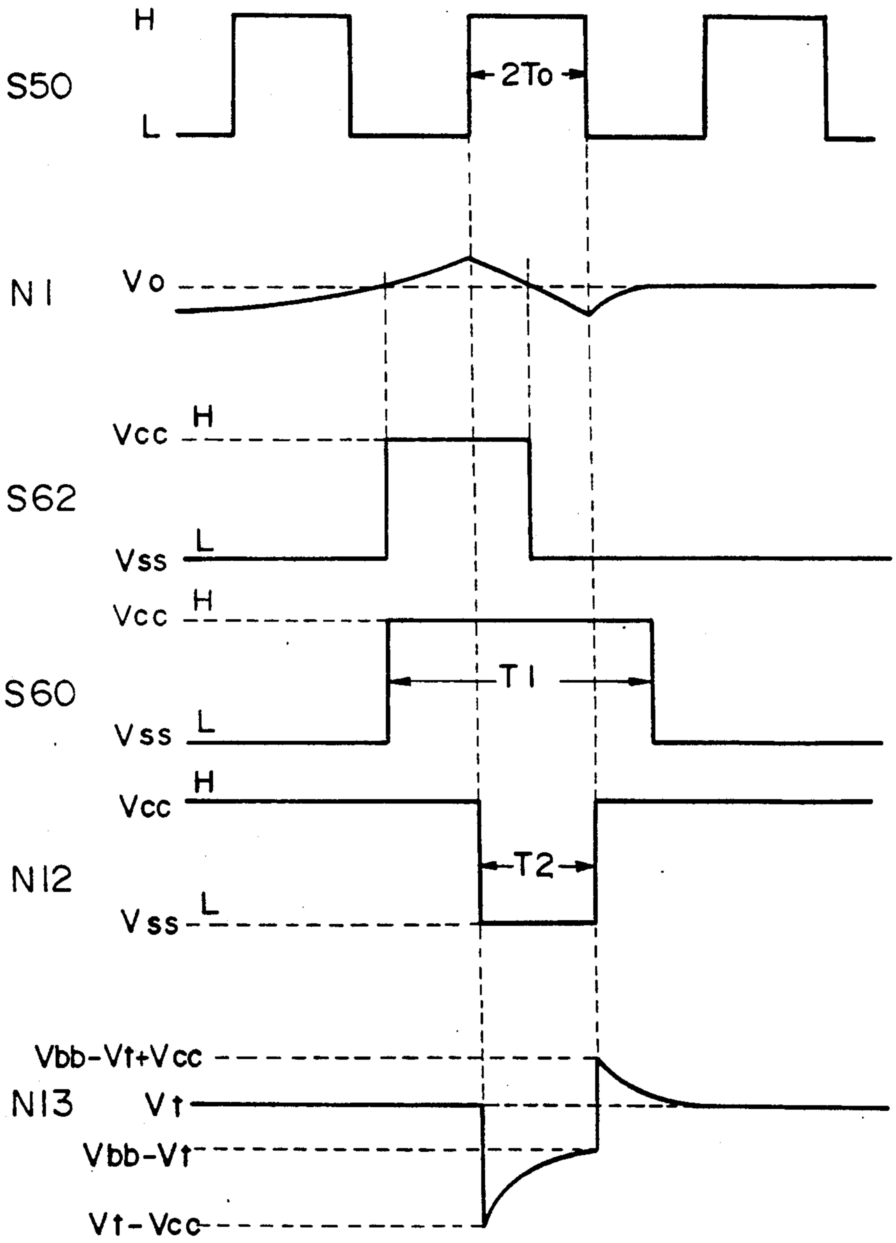
FIG. 4 is a diagram showing signals which appear in various portions of the circuitry shown in FIG. 1 or 7.

Referring to FIG. 4, T0 and T2 in FIG. 4 are respectively a minimum period of time necessary for the charge pump circuit 70 to perform a pumping operation, and the acutal pumping time of the circuit 70. In operation, when the level of the substrate bias voltage Vbb sequentially rises toward the reference level V0, as shown, which is the circuit threshold of the inverter 62*a*, the level of the node N11 rises also. As the bias voltage Vbb rises above the reference level V0, the signal S62 is turned from (logical) low level or "L" to "H" via the inverters 62*a* and 62*b* to in turn change the output of the NOR gate 63*a* from "H" to "L". In response, the inverter 65 turns the control signal S60 from "L" to "H", resulting in the charge pump circuit 70 being enabled. At the same time, the "L" level of the output of the NOR gate 63*a* turns the output of the NOR gate 63*b* from "L" to "H" and thereby causes the NOR gate 63*a* into a disable state (inhibit state). Consequently, the signal S60 is held in "H" (the enable state) at least until the output of the NOR gate 63*b* turns to "L" again, namely, during the delay time T1 of the delay circuit 64.

When the oscillator 50 turns the output pulses S50 from "L" to "H", the node N12 turns from "H" to "L". The capacitor 72 in turn lowers the potential on the node N13 to (Vt−Vcc) where Vt is the threshold voltage of the n-channel MOS transistor 73. This turns on the n-channel MOS transistor 74 with the result that the bias voltage Vbb is fed from the node N14 to the substrate 40. Afterwards, the potential on the node N13 rises to the level Vbb−Vt to thereby turn off the transistor 74.

When the bias voltage Vbb being applied to the substrate 40 is lowered, the potential of the node N11 is also lowered. Upon the latter becoming substantially equal to the circuit threshold V0 of the inverter 62*a*, the signal S62 turns from "H" to "L". However, since the ouput of the NOR gate 63*b* is in "H", the output of the NOR gate 63*a* does not change in level and, hence, the control signal S60 remains in "H". In this condition, on the turn of the output pulses S50 from "H" to "L", the node N12 changes from "L" to "H". During that change of the node N12, the capacitor 72 raises the potential on the node N13 to (Vb−Vt+Vcc). Consequently, the n-channel MOS transistor 73 is turned on, to in turn lower the potential on the node N13 to Vt.

As the delay time T1 of the delay circuit 64 expires, the output of the NOR gate 63*b* changes from "H" to "L" via the NOR gates 66 and 63*b*. Then, the output of the NOR gate 63*a* changes from "L" to "H" for the first time, resulting in the control signal being turned from "H" to "L". This completes a single pumping operation or cycle of the charge pump circuit 70.

Assume that the potential on the node N11 has been raised or lowered beyond the reference level V0 due to a change in any of the voltages Vcc, Vss and Vbb while the above-described pumping operation is under way. Even when such a change in voltage causes the duration of "H" of the signal S62 to vary, the actual pumping time T2 remains, at least once, substantially equal to or longer than the minimum necessary pumping time T0 partly because the duration of the output pulse S50 is 2T0 and partly because an arrangement is so made as to maintain the duration T1 of "H" of the control signal S60 longer than one period of the output pulses S50, i.e. 4T0. This insures sufficient rise of the potential on the node N13 and, therefore, accurate and stable pumping operations of the charge pump circuit 70.

Figure 5:
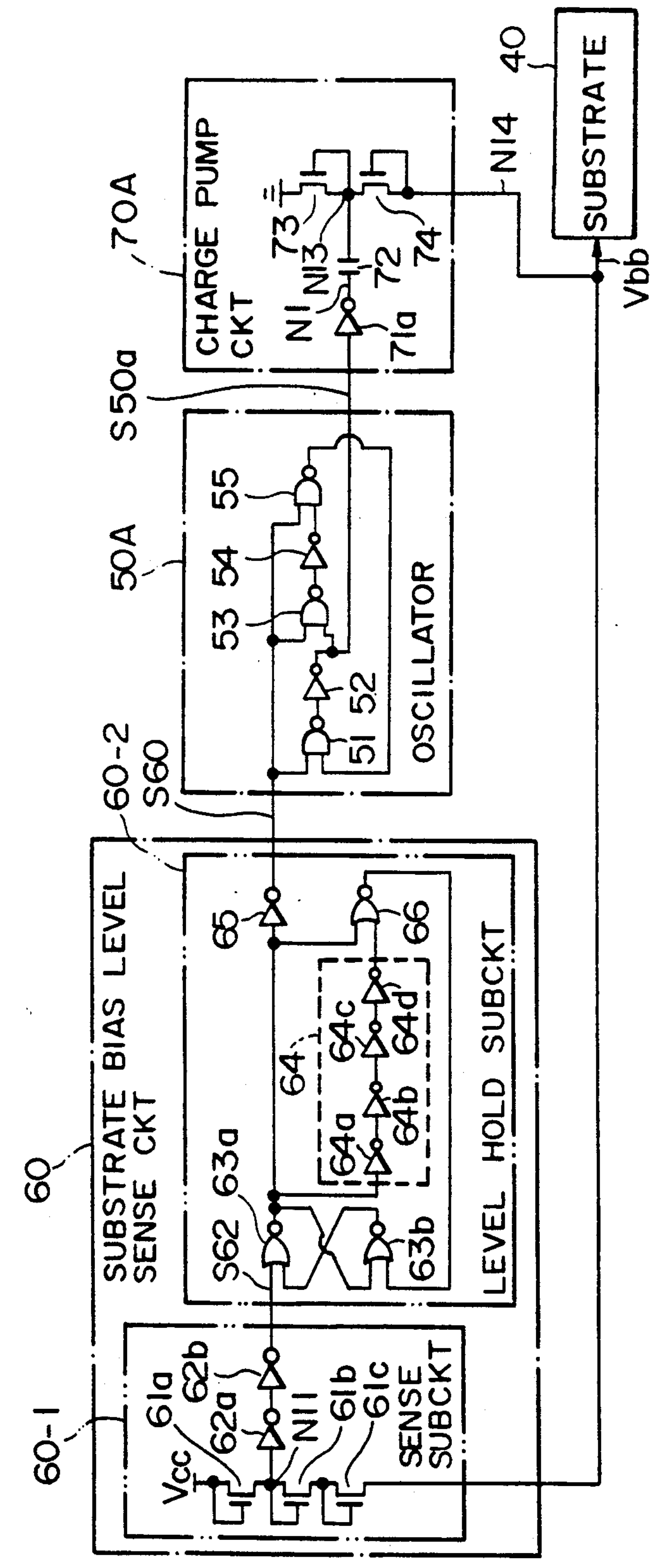
FIG. 5 is a block diagram, similar to FIG. 1, shcematically showing an alternative embodiment in accordance with the present invention.

Referring to FIG. 5, an alternative embodiment of the substrate bias generating circuitry in accordance with the present invention is shown. In the figure, the components similar to those shown in FIG. 1 are designated by like reference numerals, and redundant description will be a avoided for simplicity. The circuitry shown in FIG. 5 has an oscillator 50A which is responsive to the control signal S60 from the substrate bias level sensing circuit 60. A charge pump circuit 70A is caused into a pumping operation by output pulses 50A of the oscillator 50A.

The oscillator 50A has NAND gates 51, 53 and 55 and inverters 52 and 54 which are connected in a loop configuration. The NAND gates 51, 53 and 55 are each enabled and disabled by the control signal S60. The charge pump circuit 70A has an inverter 71*a* in place of the NAND gate 71 which is included in the charger pump circuit 70 of FIG. 1.

Figure 6:
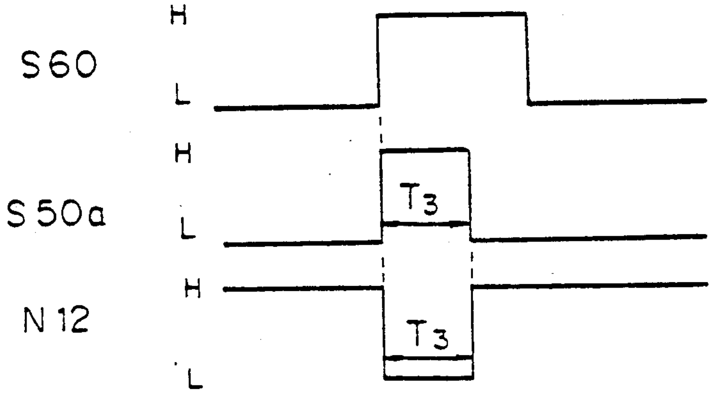
FIG. 6 shows signal waveforms useful for understanding the operation of the circuitry shown in FIG. 5.
Figure 3:
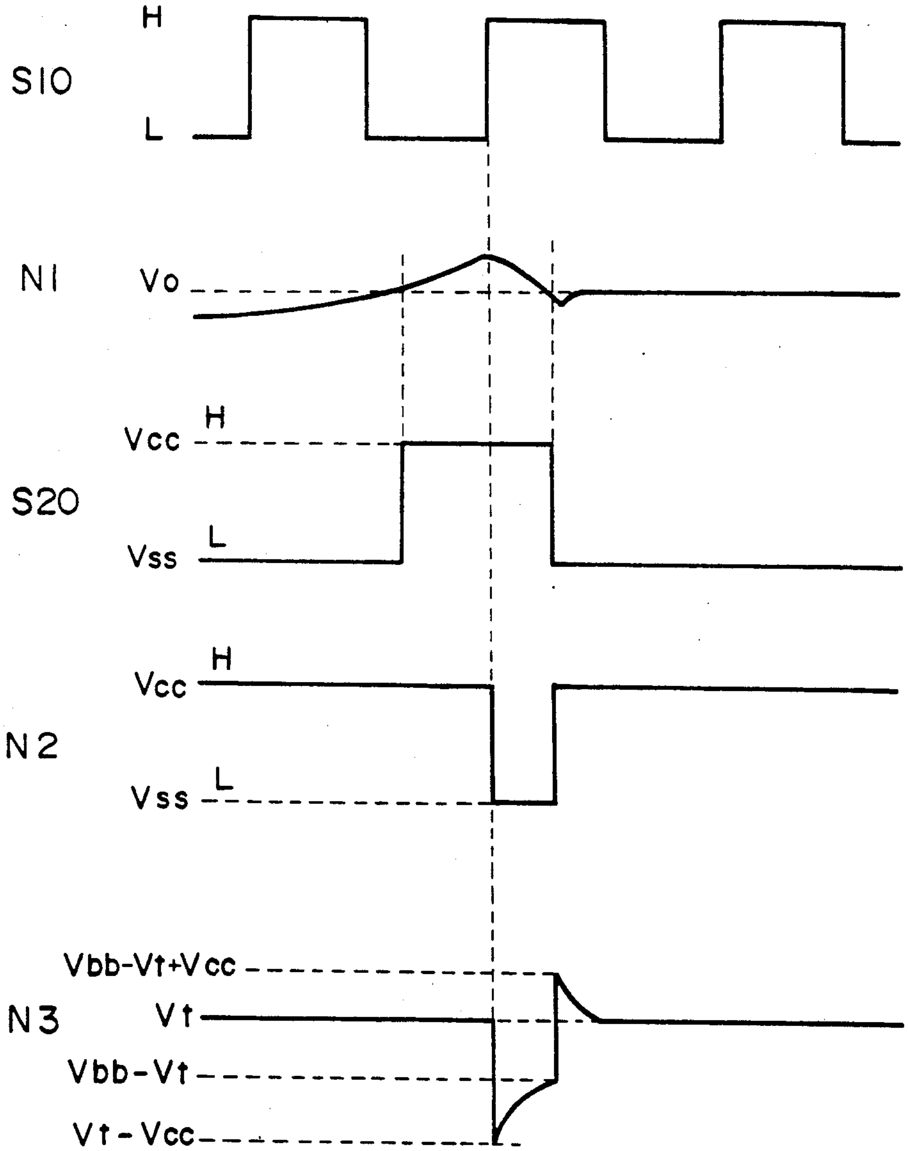
FIG. 3 PRIOR ART
FIG. 3 is a diagram showing signals which appear in various portions of the circuitry shown in FIG. 2.

The operation of the circuitry shown in FIG. 5 will be described hereinafter with reference to FIG. 6. In FIG. 6, $T_3$ indicates the duration of the ouput pulses S50*a* of the oscillator 50A.

While the control signal S60 from the substrate bias level sensing circuit 60 is in "L", the NAND gates 51, 53 and 55 of the oscillator 50A remain in a disable state so that the output pulse S50*a* coming out of the inverter 52 is in "L". On the turn of the control signal S60 to "H", one input of the NAND gates 51, 53 and 55 is primed resulting in the output of the NAND gate 53 being fed out in the form of a pulse S50*a*, FIG. 6, via the inverter 54, NAND gates 55 and 51 and inverter 52 to the charge pump circuit 70A. In this manner, while the control signal S60 is in "H", the oscillator 50A produces an output pulse S50*a*. The charge pump circuit 70A inverts the output pulse S50*a* and then performs a pumping operation with the capacitor 72 and n-channel MOS transistors 73 and 74, whereby the bias voltage Vb is generated.

The output pulse S50*a* shown in FIG. 6 has a duration $T_3$ which is so selected as to be substantially equal to the minimum period of time necessary for a pumping operation of the charge pump circuit 70A. Hence, if the delay circuit 64 has a delay time longer than $T_3$, the control signal S60 will remain in "H" for more than $T_3$. This is successful in insuring stable pumping operation of the charge pump circuit 70A, as described previously in relation to the first embodiment.

Figure 7:
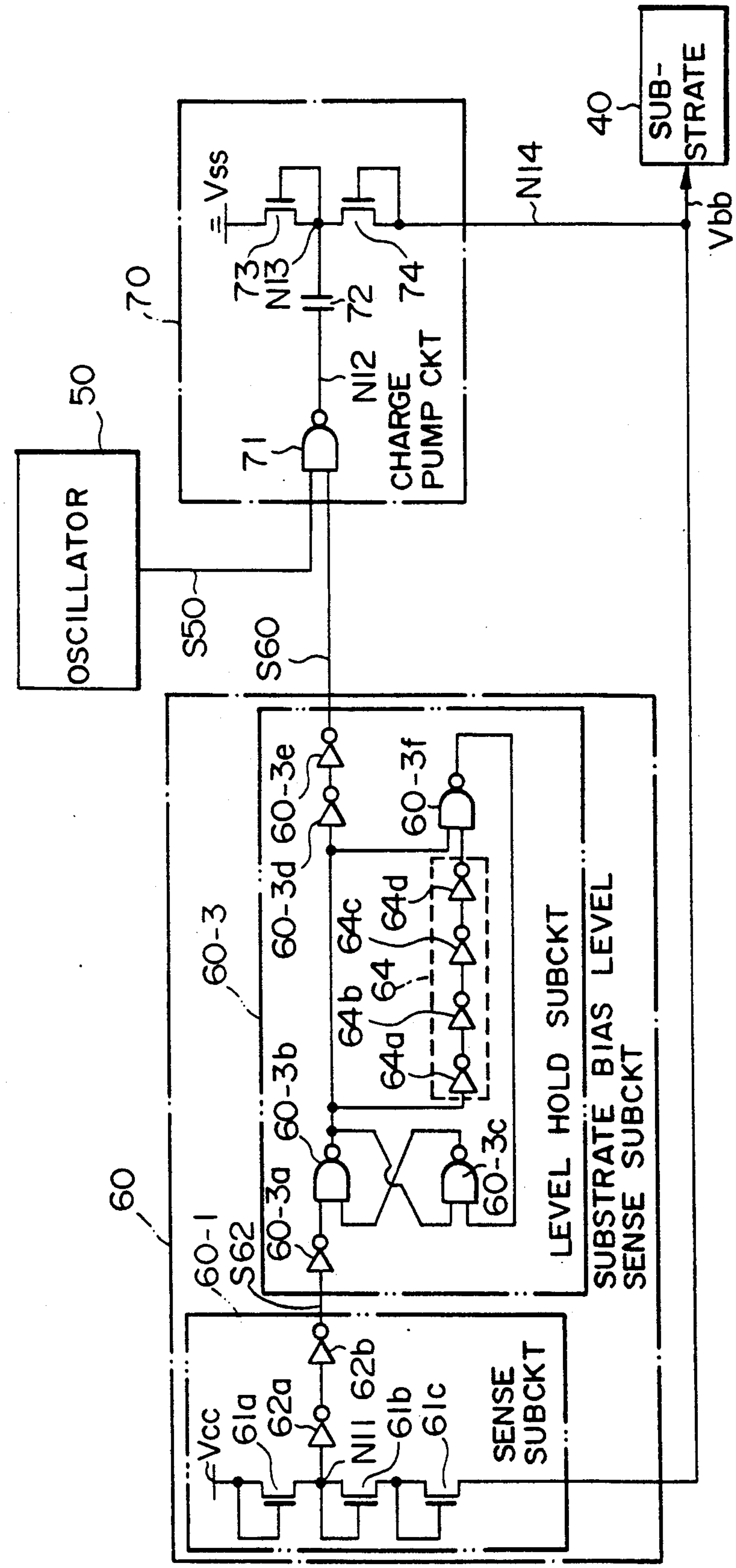
FIG. 7 is a block diagram, similar to FIG. 1 schematically showing a further alternative embodiment in accordance with the present invention.

With reference to FIG. 7, a further alternative embodiment of a substrate bias generating circuitry in accordance with the present invention includes a level holding circuit 60-3, which is different in circuit structure other than the delay circuit 64 from what is shown and described with reference to FIG. 1 but is adapted to produce control signal S60 under the same conditions. In the figure, similar components or structural elements are designated by the same reference numerals, and redundant description will be avoided for simplicity.

The level hold subcircuit 60-3 includes an inverter 60-3*a* having an input port interconnected to the output S62 from level sensing subcircuit 60-1. The inverter 60-3*a* has an output port coupled to one input of a NAND gate 60-3*b*, which has another input port coupled to an output port of additional NAND gate 60-3*c*. The NAND gate 60-3*c* has one input port interconnected to an output port of the NAND gate 60-3*b* and another input port of another NAND gate 60-3*f*. The delay circuit 64 is so connected as to received the output from NAND gate 60-3*a*, as shown. The output port of the NAND gate 60-3*b* is also coupled with an input port of an inverter 60-3*d*, which has an output port interconnected to a sole input to an additional inverter 60-3*e*, which has a single output port interconnected to the input to the NAND gate 71 included in the charge pump circuit 70. The NAND gate 60-3*f* has one input coupled to the output port of the NAND gate 60-3*b* and another input port coupled to the output node of the delay unit 64.

In operation, the substrate bias generating circuitry shown in FIG. 7 produces the signals shown in FIG. 4, which is also referenced in connection with the embodiment shown in FIG. 1. When the level of the substrate bias voltage Vbb rises toward the circuit threshold of the inverter 62*a*, or reference level, V0, the level of the node N11 rises also. As the bias voltage Vbb rises above the reference level V0, the signal S62 is turned from "L" to "H" through the inverters 62*a* and 62*b* to in turn cause the inverter 60-3*a* to change its output from "H" to "L". In response, the NAND gate 60-3*b* is turned to produce its output going from its "L" to "H". This results in the inverters 60-3*d* and 60-3 producing the control signal S60 changing from "L" to "H". The charge pump circuit 70 will then be enabled. The "H" level of the output of the NAND gate 60-3*b* turns the output of the NAND gate 60-3*c* from "H" to "L", and thereby causes the NAND gate **60-3*b* into its the disable state (inhibit state). Consequently, the signal S60 is held in its "H" state at least until the output of the NAND gate 60-3*c* turns to "H" again, that is, during the delay time T1 of the delay circuit 64**.

When the substrate bias voltage Vbb is lowered and the potential of the node N1 is also lowered to become substantially equal to the circuit threshold V0 of the inverter **62*a*, the signal S62 turns from "H" to "L", and the inverter 60-3*a* turns its output from "L" to "H". However, since the output of the NAND gate 60-3*c* is maintained in its "H" level, the output of the NAND gate 60-3*b* does not change in level and, hence, the control signal S60 remains in "H". In this condition, if the delay time T1 of the delay unit 64 expires, then the output of the NAND gate 60-3*c* changes from "L" to "H" via the NAND gates 60-3*f* and 60-3*c*. As can be seen from the above description, the embodiment shown in FIG. 7 operates in the manner similar to that of the embodiment shown in FIG. 1 with respect to production of the control signal S60. Accordingly, the embodiment shown in FIG. 7 will also establish accurate and stable pumping operations of the charge pump circuit 70**.

In summary, it will be seen that the present invention provides substrate bias generating circuitry which allows a charge pump circuit to perform a pumping operation stably and efficiently despite changes in a source voltage or similar voltage. This unprecedented advantage is derived from a delay circuit having a delay time which is at least four times as long as the duration of a single pumping operation, and a level holding circuit which holds a control signal is an enabled state at least during the delay time.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention. For example, the oscillator 50A may be implemented by any other type of gate circuit or similar logic circuit. The level sensing subcircuit 60-1 of the substrate bias level sensing circuit 60 may be constituted by p-channel MOS transistors, bipolar transistors or any other similar type of transistors. In the level holding subsection 60-2, the latch circuit may be comprised of gates other than the NOR gates **63*a* and 63*b*, while the delay circuit 64 may be implemented by any other type of gate circuit or similar logic circuit. The optimum delay time of the delay circuit 64 will be selected in matching relation to a particular circuit construction. Further, the charge pump circuit 70 or 70A** may be modified to be controlled by another kind of control signal and, if desired, even two or more charge pump circuits may be used in combination.

What is claimed is:

1. Substrate bias generating circuitry for biasing a voltage level on a substrate, comprising:

a level sensing circuit means for sensing the voltage level and producing a control signal associated with the sensed voltage level;

level holding circuit means, including a delay circuit coupled to an ouput of said level sensing circuit means, for holding the control signal in an enable state for at least a predetermined duration determined by said delay circuit, the predetermined duration being at least four times as long as a given minimum completion duration;

an oscillator for generating oscillator pulses; and a charge pump circuit for pumping the voltage level of the substrate in a pumping operation of a duration at least as long as the given minimum completion duration, said charge pump circuit including means for storing charges and being responsive to the oscillator pulses and the control signal to charge said storing means when the control signal is in the enable state, and to discharge the charges from said storing means to the substrate.

2. Substrate bias generating circuitry, according to claim 1, wherein said level holding circuit means comprises a latch circuit connected to said output of said level sensing circuit means, said latch circuit including a plurality of gates connected in cascade for latching the control signal, said delay circuit receiving the control signal and being connected with said latch circuit, said delay circuit comprising a plurality of inverters connected in series to produce the control signal with a delay equal to the predetermined time duration.

3. Substrate bias generating circuitry according to claim 2, wherein said gates of said latch circuit include:

a first NOR gate having a first input port connected to said output of said level sensing circuit means, and a second NOR gate having a first input port connected to and output port of said first NOR gate and an output port connected to a second input port of said first NOR gate, the output port of said first NOR gate being connected to an input port of a first one of said inverters;

said level holding circuit means further comprising a third NOR gate having a first input port connected to the output port of said first NOR gate, a second input port connected to an output port of a last one of said inverters, and an output port connected to a second input port of said second NOR gate, and output means connected to the output port of said first NOR gate for outputting the control signal to said charge pump circuit.

4. Substrate bias generating circuitry according to claim 2, wherein said gates of said latch circuit include:

a first NAND gate having a first input port connected to said output of said level sensing circuit means, and a second NAND gate having a first input port connected to an output port of said first NAND gate and an output port connected to a second input port of said first NAND gate, the output port of said first NAND gate being connected to an input port of a first one of said inverters;

said level circuit holding means further comprising a third NAND gate having a first input port connected to the output port of said first NAND gate, a second input port connected to an output port of a last one of said inverters, and an output port connected to a second input port of said second NAND gate, and output means connected to the output port of said first NAND gate for outputting the control signal to said charge pump circuit.

5. Subtrate bias generating circuitry according to claim 1, wherein said oscillator generates the oscillator pulses by self-oscillation.

6. Substrate bias generating circuitry according to claim 1, wherein the oscillation pulses each have a duration twice the given minimum completion duration and a period four times the given minimum completion duration.

* * * * *